US 6,564,081 B1

(12) United States Patent
Frigo et al.

(10) Patent No.: US 6,564,081 B1
(45) Date of Patent: May 13, 2003

(54) METHOD AND APPARATUS OF MR DATA ACQUISITION USING ENSEMBLE SAMPLING

(75) Inventors: Frederick J. Frigo, Waukesha, WI (US); Bruce D. Collick, Madison, WI (US); Louis M. Frigo, Brookfield, WI (US); Michael R. Hartley, Pewaukee, WI (US); Bo Pettersson, Waukesha, WI (US)

(73) Assignee: GE Medical Systems Global Technology Co. LLC, Waukesha, WI (US)

( * ) Notice: Subject to any disclaimer, the term of this patent is extended or adjusted under 35 U.S.C. 154(b) by 0 days.

(21) Appl. No.: 09/682,913

(22) Filed: Oct. 31, 2001

(51) Int. Cl.⁷ ................................................ A61B 5/055
(52) U.S. Cl. ........................ 600/410; 324/307; 324/309
(58) Field of Search ................................ 600/410, 413, 600/421; 324/307, 309, 318, 322

(56) References Cited

U.S. PATENT DOCUMENTS

| 4,386,321 A | 5/1983 | Savage |
| RE32,748 E | 9/1988 | Ordidge et al. |
| 5,084,675 A | * 1/1992 | Reinfelder et al. ......... 324/309 |
| 5,529,068 A | * 6/1996 | Hoenninger et al. ........ 600/413 |
| 5,995,556 A | 11/1999 | Thomas |
| 6,259,253 B1 | 7/2001 | Ellington |

* cited by examiner

Primary Examiner—Marvin M. Lateef
Assistant Examiner—Eleni Mantis Mercader
(74) Attorney, Agent, or Firm—Ziolkowski Patent Solutions Group, LLC; Michael A. Della Penna; Carl B. Horton (57) ABSTRACT

The present invention provides a system and method of increasing the sampling rate for MR data acquisition. By implementing ensemble sampling techniques, the present invention provides higher data sampling rates that are useful for several MR data acquisition applications including Echo Planar Imaging, Functional Magnetic Resonance Imaging, and Sensitivity Encoding Imaging (SENSE) techniques. By multiplying an MR signal by a series of pure sinusoids having the same frequency but shifted by an incremental phase, the MR signal may be separated into a number of channels which can be sampled at lower rates by analog-to-digital converters. The output from the converters may then be reconstructed using one of a number of interpolation techniques to create a single digital channel with increased bandwidth. The single channel with increased bandwidth may then be used to acquire MR data with an improved sampling rate.

34 Claims, 4 Drawing Sheets

METHOD AND APPARATUS OF MR DATA ACQUISITION USING ENSEMBLE SAMPLING

BACKGROUND OF INVENTION

The present invention relates generally to data acquisition and, more particularly, to a method and apparatus of increasing the sampling rate used for data MR acquisition using ensemble sampling techniques.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", Mz, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Generally, the MR signal resulting from the net transverse magnetic moment is demodulated to generate a band-limited MR signal. During sampling of the band-limited MR signal by a data acquisition system, a gradient coil assembly produces a readout gradient. The data acquisition system then generates an MR data set which is ultimately used to reconstruct an image using one of many well known reconstruction techniques.

A number of factors influence sampling rate which can be classified into four distinct categories: (1) analog front end; (2) input signal characteristics; (3) hardware; and (4) analog-to-digital parameters. Factors associated with the analog front end include the sensitivities of the demodulator and the anti-aliasing filter as well as the sample-hold circuitry. Input signal characteristics include the frequency of the input signal, its amplitude and bandwidth, and the noise of the signal. Hardware implemented with the system also may affect the sampling rate, i.e., number of bits, the maximum sampling rate, and the sensitivity of the analog-to-digital converter. Special characteristics of the A/D converter may also affect the sampling rate. The clock frequency, linearity, and operating temperature of the A/D converter can each affect the sampling rate of a signal.

Several techniques have been developed to increase the sampling rate used for MR data acquisition. One known technique uses "quadrature sampling" to receive "input" signals from which images may be created. Quadrature sampling involves separating an input signal into two channels by multiplying the original input signal by $\cos(\omega)$ to form an in-phase (I-channel) and by $\sin(\omega)$ to form the quadrature-phase (Q-channel). In accordance with this technique, a local oscillator produces an in-phase signal and a quadrature signal. The phase of the end-phase signal is then shifted by 90°. The shifted end-phase signal and the quadrature signal are then mixed and further processed to generate an output signal having a desired sampling rate and a desired bandwidth that may be used by an MRI system control. Sampling the I and Q channels in parallel effectively doubles the effective sampling rate of the original input signal. This technique and other known techniques, however, fail to adequately increase the sampling rate and bandwidth that are needed for several MR data acquisition applications.

It would therefore be desirable to have a system and method capable of creating a single digital channel with increased bandwidth and subsequent improved sampling rate for MR data acquisition.

BRIEF DESCRIPTION OF INVENTION

The present invention provides a system and method of increasing the sampling rate for MR data acquisition overcoming the aforementioned drawbacks. By implementing ensemble sampling techniques, the present invention provides higher data sampling rates that are useful for several MR data acquisition applications including Echo Planar Imaging, Functional Magnetic Resonance Imaging, and Sensitivity Encoding Imaging (SENSE) techniques. By multiplying an MR signal by a series of pure sinusoids having the same frequency but shifted by an incremental phase, the MR signal may be separated into a number of channels which can be sampled at lower rates by analog-to-digital converters. The output from the converters may then be reconstructed using one of a number of interpolation techniques to create a single digital channel with increased bandwidth. The single channel with increased bandwidth may then be used to acquire MR data with an improved sampling rate.

Therefore, in accordance with one aspect of the present invention, a method of increasing the sampling rate used for MR data acquisition is provided and includes acquiring MR data and combining the MR data with an ensemble function. The method further includes separating the MR data and ensemble function into a number of channels and sampling and converting data from the number of channels to digitize the data. The method also includes reconstructing the digitized data to create a single channel of data with increased bandwidth.

In accordance with a further aspect of the present invention, a computer readable storage medium is provided having stored thereon a computer program representing a set of instructions that when executed by a computer causes a transceiver to detect an MR data signal and demodulate the MR data signal to generate a band-limited analog MR data signal. The computer is further programmed to combine the band-limited analog MR data signal with a number of ensemble functions and input the signal resulting therefrom into a number of analog-to-digital converters. The computer program then causes the computer to detect analog-to-digital converter output and generate a single digital channel with increased bandwidth from the output.

In accordance with another aspect of the present invention, an MRI apparatus to acquire MR data with increased sampling is disclosed. The apparatus includes an MRI system having a number of gradient coils positioned about a bore of a magnet to impress a polarizing magnetic field and an RF transceiver system and an RF modulator controlled by a pulse control module to transmit RF signals to an RF coil assembly to acquire MR images. The MRI apparatus also includes a computer programmed to input an MR data signal to a demodulator configured to demodulate the MR data signal into a band-limited MR signal. The computer is further programmed to generate a set of ensemble signal channels by combining the band-limited MR signal by a plurality of ensemble functions and convert the ensemble signal channels to a number of discrete ensemble digital channels. The number of discrete ensemble digital channels is then formed into a single discrete digital channel having an increased bandwidth.

In accordance with yet another aspect of the present invention, a method of increasing the sampling rate used for MR data acquisition is provided and includes generating a polarizing magnetic field across a field of view. An RF signal is then applied to produce transverse magnetization in a region of interest of the magnetic field. The method further includes detecting an MR signal resulting from the transverse magnetization and demodulating the signal to generate a band-limited MR signal. The band-limited MR signal is then multiplied by a plurality of ensemble functions. Thereafter, the multiplied band-limited MR signal is then separated into a number of channels whereupon each channel is sampled to generate a single digital channel with increased bandwidth thereby providing an increased sampling rate for data acquisition.

In accordance with yet a further aspect of the present invention, an apparatus for producing an MR data set from an MR signal is provided and comprises a magnet for producing a polarizing magnetic field and an RF coil for producing transverse magnetization in a region of interest of the polarizing field. The apparatus further includes a receiver configured to receive an MR signal resulting from the transverse magnetization as well as a demodulator configured to demodulate the signal to generate a band-limited MR signal. A gradient coil assembly is provided for producing a readout gradient during sampling of the received MR signal as well as a data acquisition system for sampling the band-limited MR signal and generating an MR data set having a sampling rate more than twice that of the band-limited MR signal. The apparatus further includes a pulse generation system configured to control the synchronized operation of the RF coil, gradient coil assembly, and the data acquisition system. A processing system is also provided for reconstructing an image from the data set.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
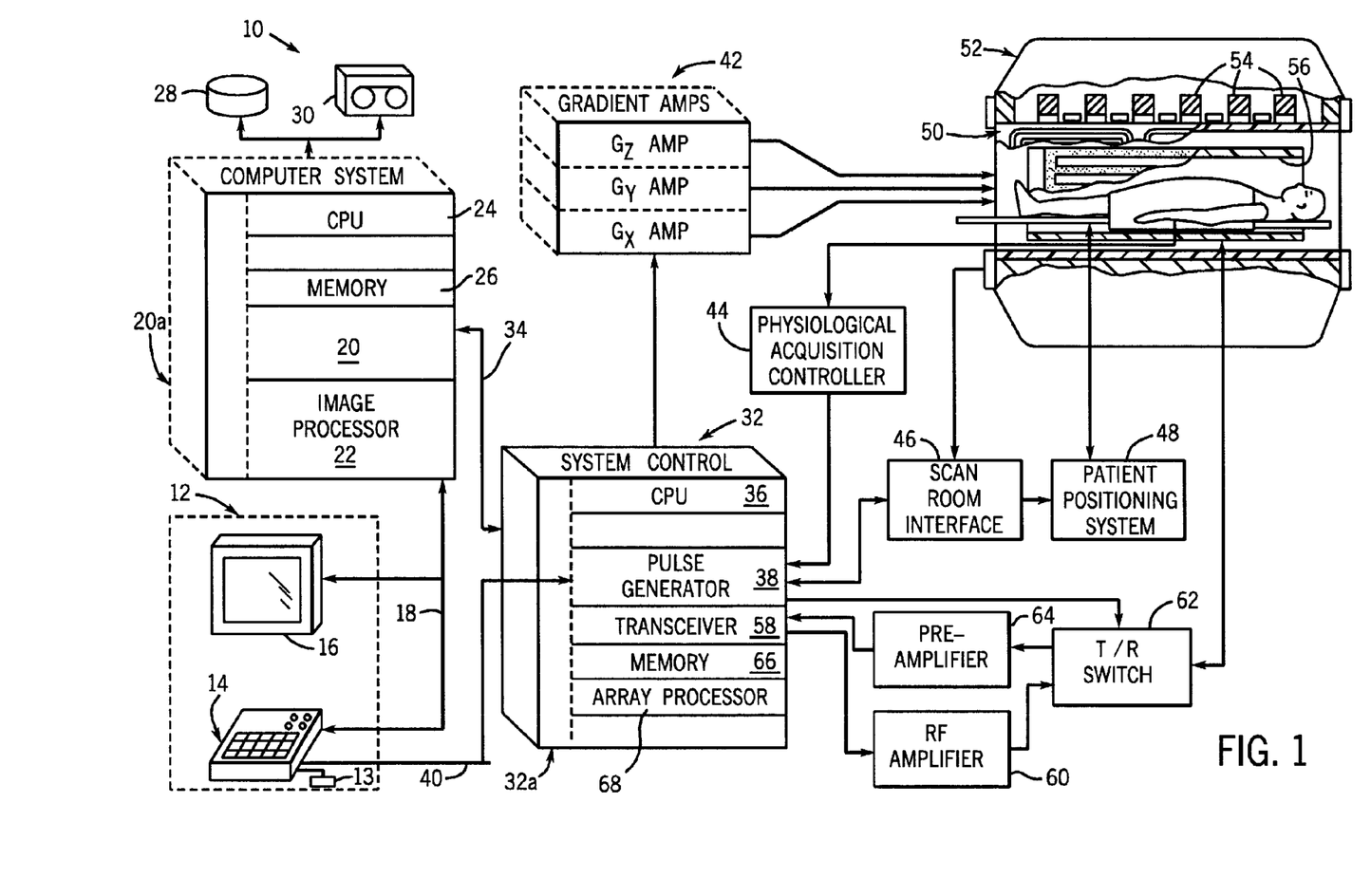
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 or a removable digital media for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as the tape drive 30, or it may be further processed by the image processor 22 and conveyed to the operator console 12 and presented on the display 16.

The present invention is directed to acquiring MR imaging data with an increased and/or improved sampling rate. The steps of a process to generate a digital data acquisition channel with increased bandwidth are set forth in FIG. 2. The present invention also contemplates a computer program to automatically carry out the steps necessary to acquire MR imaging data with a faster sampling rate. The commands of the computer program will likewise be referenced with the description below of FIG. 2.

Figure 2:
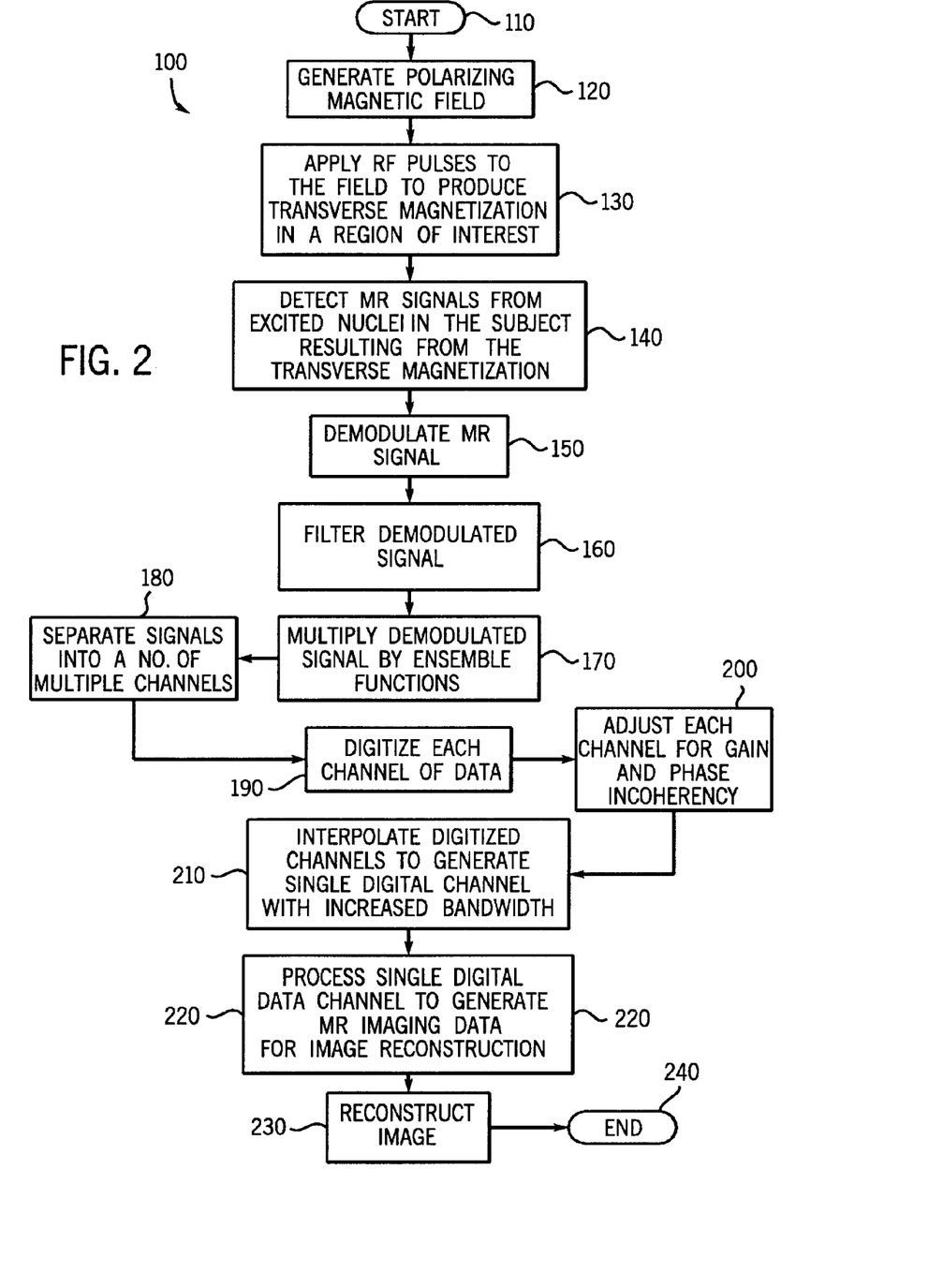
FIG. 2 is a flow chart showing an example for increasing sampling rate for MR data acquisition in accordance with the present invention.

A process 100 for increasing the sampling rate used for MR data acquisition begins at 110 with generation of a polarizing magnetic field 120 across the subject to be scanned, i.e. a medical patient. After the polarizing magnetic field is generated, an RF coil assembly 56, FIG. 1, is energized to produce transverse magnetization in a volume-of-interest (VOI) in the polarizing field 130. Signals emitted by the excited nuclei resulting from the transverse magnetization are detected at 140 and demodulated at 150. Demodulation of the detected MR signals results in generation of a band-limited MR signal, 5. The band-limited MR signal is then filtered at 160 by an anti-aliasing filter, as is well known.

At 170, the filtered band-limited MR signal is multiplied by a set of ensemble functions. In a preferred embodiment, the set of ensemble functions is a series of pure sinusoids of the same frequency shifted by an incremental phase. Multiplying the band-limited MR signal by the pure sinusoids results in a set of ensemble signals, $E_n$, which may be separated into multiple channels that may be sampled at lower rates by analog-to-digital converters, as will be discussed shortly. The set of ensemble signals, $E_n$, may be defined by:

$$E_n = S^* \psi_n \quad \text{(Eqn. 1)}.$$

where S is the band-limited MR signal and $\psi_n$ is the set of ensemble sampling functions at a constant frequency, $\omega$, shifted by a constant phase, $\theta_n$. $\theta_n$ may be defined by:

$$\theta_n = (\pi/M)^* n, \quad \text{(Eqn. 2)}.$$

where M is the number of channels for n=0, ..., (M−1).

The set of ensemble sampling functions, $\psi_n$, may be defined by:

$$\psi_n = \cos((\omega + \theta_n)t) \text{ for } n=0, \ldots, (M-1) \quad \text{(Eqn. 3)}.$$

After the band-limited MR signal is multiplied by the ensemble functions at 170 to generate a set of ensemble signals, the ensemble signals are separated into a number of channels at 180. That is, the demodulated MR signal is multiplied by four sinusoids out of phase with respect to one another at 170 and then the multiplied signals are separated into four channels at 180. There is a one-to-one relationship between the number of channels into which the signals are separated and the number of sinusoids multiplied to the demodulated signal at 170. Once the signals are separated into a number of channels at 180, each channel is digitized by an analog-to-digital converter configured to convert an ensemble signal to a discrete ensemble digital data channel 190. After each channel is digitized at 190 by the analog-to-digital converter, a number of discrete ensemble digital channels, $\phi_n$, results. As indicated previously, since the MR signal is separated into multiple channels, the MR signal may be sampled at lower rates by the analog-to-digital converters.

Following digitization of each channel at 190, each channel is adjusted at 200 for a gain and phase incoherence. A number gain calibration and phase calibration techniques may be used to compensate for differences in the gain of the individual analog-to-digital converter stages and for non-uniform phase differences that may exist in individual channels, respectively. Since each separate channel is sampled with a different A/D converter and each separate channel has its own sample-hold circuitry, each channel should, in a preferred embodiment, undergo a gain calibration. Further, each channel is created by multiplying an input signal by a sinusoidal input, therefore, each channel should, in a preferred embodiment, undergo a phase calibration to assure phase coherence among the signals.

After each channel is adjusted to compensate for gain and phase incoherencies, the multitude of discrete ensemble digital channels are combined 210 to generate a single digital channel with increased bandwidth. The set of digital data channels is combined into a single real-valued or complex-valued MR data set, X, which represents a sampled version of the band-limited MR signal, S, set forth above. A number of interpolation schemes may be utilized to combine the data channels into a single channel, such as a since interpolation. Because the single digital data channel has an increased bandwidth, the channel may be processed with a greater sampling rate to generate MR imaging data for image reconstruction at 220. Acquiring data for image reconstruction with an improved sampling rate allows for reconstruction of an image with greater sensitivity to the volume of interest, improved signal to noise, improved image quality, and improved overall diagnostic value. After the single digital data channel is processed at 220, an image is reconstructed using known imaging techniques at 230 whereupon process 100 ends at 240.

Figure 3:
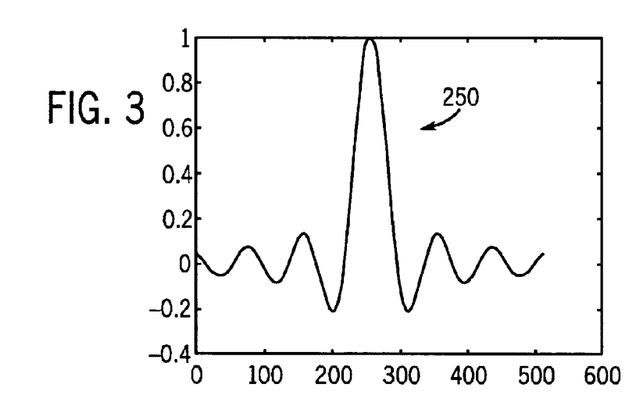
FIG. 3 is a graphical representation of a band-limited MR signal.
Figure 4:
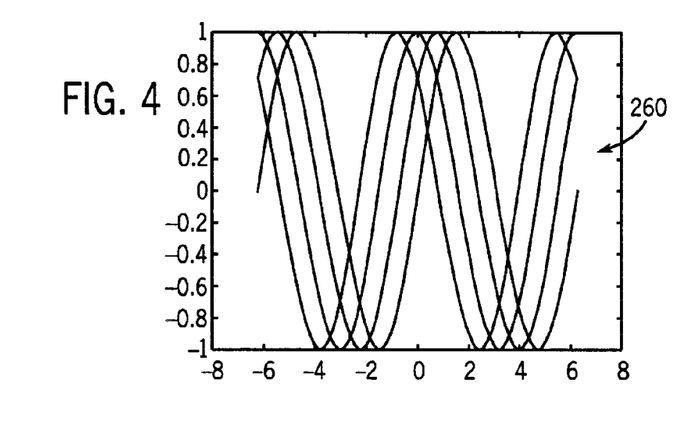
FIG. 4 is a graphical representation of a set of ensemble functions in accordance with the present invention.

Now referring to FIGS. 3–6, representations of signals generated in accordance with the ensemble sampling techniques of the present invention are shown. FIGS. 3–6 will be discussed with reference to a four channel ensemble sampling technique, but the present invention is applicable with less than four channels as well as more than four channels. Shown in FIG. 3 is a representation of a typical band-limited MR signal 250 detected from excited nuclei following application of an RF signal to produce transverse magnetization and a volume of interest of a polarized magnetic field, having been demodulated and filtered using known processing techniques. In accordance with the present invention, signal 250 is multiplied by a number of ensemble functions, shown in FIG. 4. In a four channel embodiment, four ensemble functions, generally referenced 260 include four pure sinusoids having a constant frequency but shifted by incremental phase. As indicated previously, the ensemble when multiplied to the MR signal 250 will subsequently allow for separation of the band-limited MR signal into a number of data channels that may be digitized at lower sampling rates.

Figure 5:
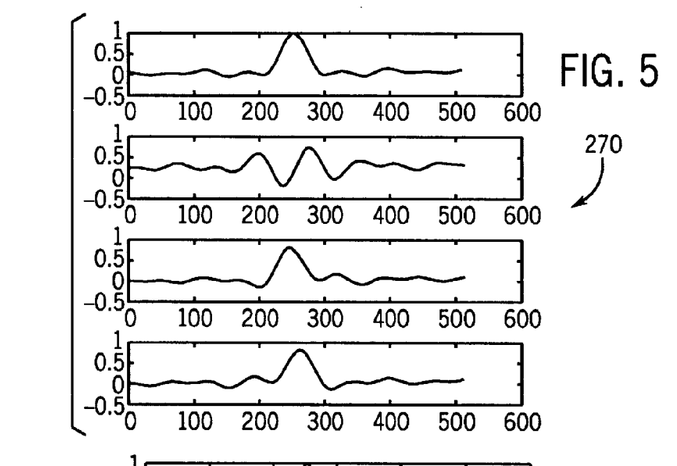
FIG. 5 is a graphical representation of a combination of the signals shown in FIGS. 3 and 4.
Figure 6:
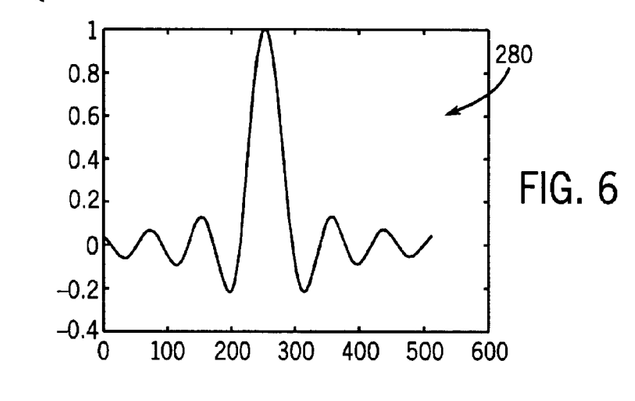
FIG. 6 is a graphical representation of an output signal similar to that shown in FIG. 3 but having increased sampling rate.

FIG. 5 is a representation of ensemble signals 270 that result in the multiplication of signal 250 and functions 260. The ensemble signals 270 are then input to a number of analog-to-digital converters to convert the signals into discrete ensemble digital channels. The discrete ensemble digital data channels are then combined into a single real-valued or complex-valued MR data set, X, which represents a sampled version of the band-limited MR signal 250 of FIG. 3. FIG. 6 is a representation of the output signal 280 resulting from the combination of the set of digital data channels into a single real-valued or complex-valued MR data set. As indicated previously, output signal 280 represents a sampled version of the band-limited MR signal 250 shown in FIG. 3. A number of interpolation schemes may be employed such as since interpolation to combine the discrete ensemble digital data channels into the single channel 280 shown in FIG. 6. When combined, output signal 280 has a sampling rate greater than the sampling rate of each A/D converter. For example, using four A/D converters in parallel at 1 MHz will result in a single digital output signal with a 4 MHz sampling rate. In another embodiment, an eight channel ensemble sampling mechanism may be implemented to effectively increase the sampling rate of an original MR input signal by eight fold.

Figure 7:
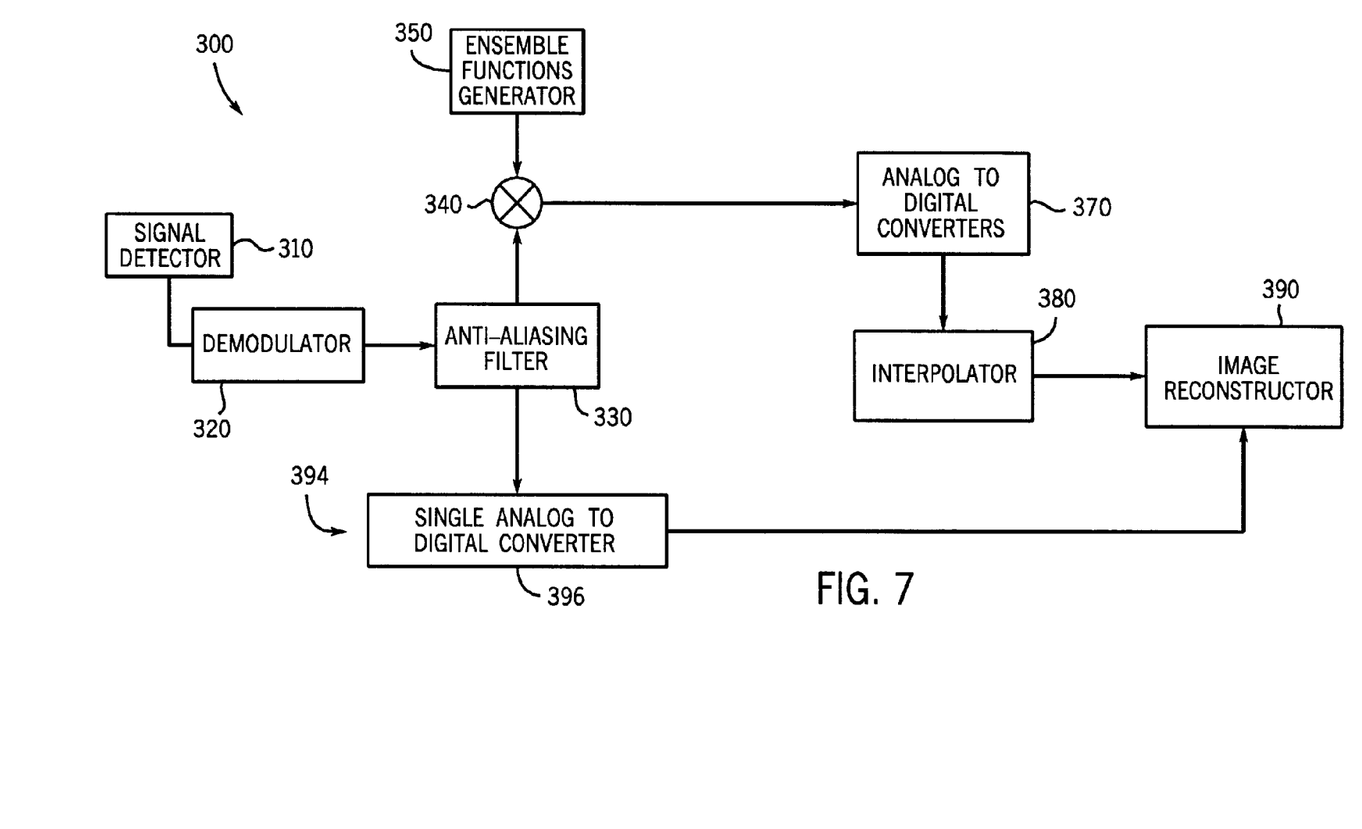
FIG. 7 is a schematic block diagram of a signal processing system in accordance with the present invention.

FIG. 7 is a schematic block diagram of a data acquisition apparatus 300 for use with the present invention. Apparatus 300 includes a signal detector 310 configured to detect an MR signal and input the MR signal into a demodulator 320. The demodulator 320 is connected to an anti-aliasing filter 330 and configured to input into filter 330 a demodulated MR signal. Connected to the anti-aliasing filter 330 are in the preferred embodiment, a number of signal multipliers 340. Each signal multiplier 340 is configured to combine the filtered MR signal output from filter 330 with an ensemble function created output by an ensemble function generator 350. In a preferred embodiment, the ensemble functions are a series of pure sinusoids having a common frequency and shifted by an incremental phase. The outputs of each signal multiplier create a separate data channel as shown in FIG. 5. The number of data channels are then input to a corresponding number of analog-to-digital converters 370 which are configured to digitize the analog signal and generate a set of digital data channels therefrom. Output from the analog-to-digital converters 370 is then input into an interpolator 380 which is connected to the A/D converters 370 and configured to combine the number of digital data channels into a single digital data channel having increased bandwidth. In a preferred embodiment, interpolator 380 combines the multiple data channels into a single digital data channel using an interpolation technique. Connected to the interpolator 380 is an image reconstructor 390 that is configured to take as input the interpolator output and reconstruct an MR image therefrom. In an alternative embodiment, apparatus 300 further includes a bypass processing system generally referenced 394 wherein output from the antialiasing filter 330 is input to a single analog-to-digital converter 396 having an output that is then input to the image reconstructor 390. With this alternate embodiment, the demodulated and filtered MR signal does not undergo ensemble sampling and is therefore applicable for those imaging applications requiring lower bandwidth.

The present invention provides a process for increasing a sampling rate used for MR data acquisition by employing ensemble sampling techniques. Higher data sampling rates are useful for many MR data acquisition applications such as Echo Planar Imaging, Functional Magnetic Resonance Imaging, and Sensitivity Encoding (SENSE) Imaging techniques. Improving the sampling rate used for data acquisition yields a more sensitive reconstructed image having improved signal to noise ratio and overall image quality.

Therefore, in accordance with one embodiment of the present invention, a method of increasing the sampling rate used for MR data acquisition is provided and includes acquiring MR data and combining the MR data with an ensemble function. The method further includes separating the MR data and ensemble function into a number of channels and sampling and converting data from the number of channels to digitize the data. The method also includes reconstructing the digitized data to create a single channel of data with increased bandwidth.

In accordance with another embodiment of the present invention, a method of increasing the sampling rate used for MR data acquisition is provided and includes generating a polarizing magnetic field across a field of view. An RF signal is then applied to produce transverse magnetization in a region of interest of the magnetic field. The method further includes detecting an MR signal resulting from the transverse magnetization and demodulating the signal to generate a band-limited MR signal. The band-limited MR signal is then multiplied by a plurality of ensemble functions. Thereafter, the multiplied band-limited MR signal is then separated into a number of channels whereupon each channel is sampled to generate a single digital channel with increased bandwidth thereby providing an increased sampling rate for data acquisition.

In accordance with a further embodiment of the present invention, a computer readable storage medium is provided having stored thereon, a computer program representing a set of instructions that when executed by a computer causes the transceiver MR data signal and demodulate the MR data signal to generate a band-limited analog MR data signal. The computer is further programmed to combine the band-limited analog MR data signal with a number of ensemble functions and input the signal resulting therefrom into a number of analog-to-digital converters. The computer program then causes the computer to detect analog-to-digital converter output and generate a single digital channel with increased bandwidth from the output.

In accordance with another embodiment of the present invention, an MRI apparatus to acquire MR data with increased sampling is disclosed. The apparatus includes an MRI system having a number of gradient coils positioned about a bore of a magnet to impress a polarizing magnetic field and an RF transceiver system and an RF modulator controlled by a pulse control module to transmit RF signals to an RF coil assembly to acquire MR images. The MRI apparatus also includes a computer programmed to input an MR data signal to a demodulator configured to demodulate the MR data signal into a band-limited MR signal. The computer is further programmed to generate a set of ensemble signals by multiplying the band-limited MR signal by a plurality of ensemble functions. The set of ensemble signals is the input into a number of analog-to-digital converters configured to convert the ensemble signals to a number of discrete ensemble digital channels. The number of discrete ensemble digital channels is then combined into a single discrete digital channel having an increased bandwidth.

In accordance with yet another embodiment of the present invention, an apparatus for producing an MR data set from an MR signal is provided and comprises a magnet for producing a polarizing magnetic field and an RF coil for producing transverse magnetization in a region of interest of the polarizing field. The apparatus further includes a receiver configured to receive an MR signal resulting from the transverse magnetization as well as a demodulator configured to demodulate the signal to generate a band-limited MR signal. A gradient coil assembly is provided for producing a readout gradient during sampling of the received MR signal as well as a data acquisition system for sampling the band-limited MR signal and generating an MR data set having a sampling rate more than twice that of the band-limited MR signal. The apparatus further includes a pulse generation system configured to control the synchronized operation of the RF coil, gradient coil assembly, and the data acquisition system. A processing system is also provided for reconstructing an image from the data set.

In an alternate embodiment of the present invention, a single analog-to-digital converter is used as a bypass processing system without ensemble sampling for applications requiring lower bandwidth. In this embodiment, the band-limited MR signal is input to a single analog-to-digital converter. The analog-to-digital converter processes the band-limited MR signal to output a single real-valued or complex-valued MR data set that may be sampled to acquire data for image reconstruction.

The present invention has been described in terms of the preferred embodiment, and it is recognized that equivalents, alternatives, and modifications, aside from those expressly stated, are possible and within the scope of the appending claims.

What is claimed is:

1. A method of increasing the sampling rate used for MR data acquisition, the method comprising:
   acquiring MR data;
   multiplying the MR data with a series of pure sinusoids having a common frequency and shifted by an incremental phase;
   separating the MR data and ensemble function into a number of channels;
   sampling and converting data from the number of channels to digitize the data; and
   reconstructing the digitized data to create a single channel of data with increased bandwidth.

2. The method of claim 1 wherein acquiring includes:
   generating a polarizing magnetic field across an VOI;
   applying an RF signal to produce transverse magnetization in the VOI; and
   detecting an MR signal resulting from the transverse magnetization.

3. The method of claim 2 further comprising demodulating and filtering the MR signal.

4. The method of claim 1 further comprising adjusting each of the number of channels to account for at least one of gain and phase incoherence.

5. The method of claim 1 wherein reconstructing includes interpolating the digitized data using a sinc function.

6. A computer readable storage medium having stored thereon a computer program representing a set of instructions that when executed by a computer causes the computer to:
   detect an MR data signal;
   demodulate the MR data signal to generate a band-limited analog MR data signal, S;
   combine the band-limited analog MR data signal with at least two ensemble functions;
   input the band-limited analog MR data signal and the at least two ensemble functions to a number of analog-to-digital (A/D) converters;
   detect AID converter output; and
   generate a single digital channel, X, with increased bandwidth from the converter output.

7. The computer readable storage medium of claim 6 wherein the set of instructions further causes the computer to input the band-limited analog MR data signal into a single AID converter without ensemble sampling for imaging applications requiring lower bandwidth.

8. The computer readable storage medium of claim 6 wherein the single digital channel includes a single real-valued or single complex-valued MR data set.

9. The computer readable storage medium of claim 6 wherein the set of instructions farther causes the computer to input S into an anti-aliasing filter.

10. The computer readable storage medium of claim 9 wherein the set of instructions further causes the computer to multiply S by a number of ensemble functions, $\psi_n$, and generate a set of ensemble signals, $E_n$.

11. The computer readable storage medium of claim 10 wherein the set of instructions further causes the computer to input $E_n$ to the number of A/D converters configured to convert $E_n$ to a number of discrete ensemble digital data channels, $\Phi_n$.

12. The computer readable storage medium of claim 11 wherein the set of instructions further causes the computer to combine $\Phi_n$ into a single real-valued MR data set or a single complex-valued MR data set, X, representative of S with an increased sampling rate.

13. The computer readable storage medium of claim 12 wherein the set of instructions further causes the computer to interpolate $\Phi_n$ to combine $\Phi_n$ into a single digital channel, X, with increased bandwidth.

14. The computer readable storage medium of claim 13 wherein the set of instructions further causes the computer to utilize the MR imaging data contained in X for image reconstruction with an increased sampling rate.

15. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil Assembly to acquire MR images; and
   a computer programmed to:
      receive an MR data signal and demodulate the MR data signal into a band-limited MR signal, S;
      generate a set of ensemble signal channels, $E_n$, by combining S with a plurality of ensemble functions, $\psi_n$ and convert $E_n$ to a number of discrete ensemble digital channels, $\Phi_n$; and
   form $\Phi_n$ into a single discrete digital channel, X, having increased bandwidth compared to that of S.

16. The system of claim 15 wherein the computer is further programmed to combine $\phi_n$ into the single discrete digital channel, X, by interpolating $\phi_n$ with a sinc function.

17. The system of claim 15 wherein $E_n = S^* \psi_n$ and wherein $\psi_n = \cos((\omega+\theta_n)t)$, where $\theta_n = (\pi/M)^*n$, and M equals the number discrete ensemble digital channels for n=0, . . . , (M−1).

18. The system of claim 15 wherein the computer is further programmed to input S into an anti-aliasing filter and multiply an anti-aliasing filter output by $\psi_n$.

19. The system of claim 15 wherein X includes one of a single real-valued MR data set and a single complex-valued MR data set.

20. The system of claim 15 wherein the computer is programmed to employ at least one of a gain calibration and a phase calibration to compensate for differences in gain of each A/D converter and to compensate for non-uniform phase differences of each discrete ensemble digital channel, respectively.

21. The system of claim 15 wherein the computer is programmed to acquire MR imaging data with an increased sampling rate.

22. A method of increasing the sampling rate used for MR data acquisition, the method comprising:

generating a polarizing magnetic field across an VOI;

applying an RF signal to produce transverse magnetization in the VOI;

detecting and demodulating an MR signal resulting from the transverse magnetization;

generating a band-limited MR signal S from the demodulated MR signal;

multiplying the band-limited MR signal S by an ensemble function $\psi_n$, wherein $\psi_n$ includes a plurality of pure sinusoids, each sinusoid having a constant frequency, $\omega$, shifted by a constant phase, $\theta_n$;

separating the multiplied band-limited MR signal $E_n$ into a number of channels;

digitizing the number of channels to generate a number of digital MR data channels $\Phi_n$; and combining $\Phi_n$ into a digital data channel X.

23. The method of claim 22 wherein $0_n = (\pi/M)*n$, where M is the number of channels for n=0, . . . , (M−1); and $\psi_n - \cos((\omega+\theta_n))t)$ for n=0, . . . , (M−1).

24. The method of claim 23 werein $E_n = S*\psi_n$ and further comprising interpolating $\phi_n$ to generate X.

25. The method of claim 22 further comprising adjusting each of the number of channels, $\phi_n$, to account for at least one of gain and phase incoherence.

26. The method of claim 22 wherein X includes a single real-valued or complex-valued digital MR data set.

27. An apparatus to produce an MR data set from an MR signal, the apparatus comprising:

a magnet configured to produce a polarizing magnetic field;

an RF coil configured to produce transverse magnetization in a region of interest of the polarizing field;

a receiver configured to receive an MR signal resulting from the transverse magnetization;

a demodulator configured to generate a band-limited MR signal S;

a data acquisition system configured to simple the band-limited MR signal without quadrature sampling and generate an MR data set having a sampling rate more than twice that of the band-limited MR signal;

a gradient coil assembly configured to produce a readout gradient during sampling the receive MR signal;

a pulse generation system for controlling the synchronized operation of the RF coil, gradient coil assembly, and data acquisition system; and a processing system for generating results from the MR data set.

28. The apparatus of claim 27 further comprising an anti-aliasing filter configured to filter the band-limited MR signals.

29. The apparatus of claim 28 further comprising an ensemble function generator configured to generate a series of pure sinusoids having a common frequency and shifted by an incremental phase.

30. The apparatus of claim 29 further comprising a multiplier connected to the anti-aliasing filter and the ensemble function generator and configured to multiply the band-limited MR signal by the series of pure sinusoids.

31. The apparatus of claim 30 further comprising a plurality of A/D converters configured to digitize the number of data channels.

32. The apparatus of claim 31 further comprising an interpolator configured to combine A/D converter output into a single digital channel of MR data having increased bandwidth.

33. The apparatus of claim 27 further comprising a bypass processing system configured to input the band-limited MR signal into a single A/D converter to generate a set of MR imaging data without ensemble sampling for low bandwidth applications.

34. A method of MR data acquisition comprising the steps of:

detecting an MR signal resulting from transverse magnetization in a polarized magnetic field;

ensemble sampling the MR signal to create a set of data channels, each data channel having a sampled portion of the MR signal;

digitizing the sampled signal of each data channel; and reconstructing an MR image from the digitized sampled signals.

* * * * *

UNITED STATES PATENT AND TRADEMARK OFFICE
CERTIFICATE OF CORRECTION

PATENT NO. : 6,564,081 B1
DATED : May 13, 2003
INVENTOR(S) : Frigo et al.

It is certified that error appears in the above-identified patent and that said Letters Patent is hereby corrected as shown below:

Column 10,
Lines 4 and 10, delete "AID" and substitute therefor -- A/D --;

Column 11,
Line 31, delete "$\psi_n - \cos((\omega + \theta_n)t)$" and substitute therefor -- $\psi_n = \cos((\omega + \theta_n)t)$ --;

Column 12,
Line 1, delete "simple" and substitute therefor -- sample --;
Line 6, insert -- of -- after "sampling".

Signed and Sealed this

Second Day of September, 2003

JAMES E. ROGAN
*Director of the United States Patent and Trademark Office*